(12) United States Patent
Hatano et al.

(10) Patent No.: US 11,099,240 B2
(45) Date of Patent: Aug. 24, 2021

(54) DEVICE AND METHOD FOR EVALUATING ENERGY STORAGE DEVICE AND EVALUATION SYSTEM

(71) Applicants: Kabushiki Kaisha Toshiba, Minato-ku (JP); Toshiba Energy Systems & Solutions Corporation, Kawasaki (JP)

(72) Inventors: Hisaaki Hatano, Yokohama (JP); Takahiro Yamamoto, Fuchu (JP); Kenichi Fujiwara, Kawasaki (JP); Masatake Sakuma, Chiba (JP); Takenori Kobayashi, Meguro (JP); Yasuhiro Ogura, Yokohama (JP); Kenji Mitsumoto, Kawasaki (JP)

(73) Assignees: Kabushiki Kaisha Toshiba, Minato-ku (JP); Toshiba Energy Systems & Solutions Corporation, Kawasaki (JP)

( * ) Notice: Subject to any disclaimer, the term of this patent is extended or adjusted under 35 U.S.C. 154(b) by 168 days.

(21) Appl. No.: 16/567,011

(22) Filed: Sep. 11, 2019

(65) Prior Publication Data

US 2020/0217896 A1 Jul. 9, 2020

(30) Foreign Application Priority Data

Jan. 4, 2019 (JP) .............................. JP2019-000285

(51) Int. Cl.
*G01R 31/367* (2019.01)
*H01M 10/48* (2006.01)
(Continued)

(52) U.S. Cl.
CPC ......... *G01R 31/367* (2019.01); *G01R 31/374* (2019.01); *G01R 31/382* (2019.01); *H01M 10/4285* (2013.01); *H01M 10/48* (2013.01)

(58) Field of Classification Search
CPC .. G01R 31/367; G01R 31/374; G01R 31/382; H01M 10/48; H01M 10/4285;
(Continued)

(56) References Cited

U.S. PATENT DOCUMENTS 7,688,033 B2     3/2010  Minamiura
9,465,080 B2 *  10/2016  Wiegman ............. G01R 31/378
(Continued)

FOREIGN PATENT DOCUMENTS

GB          2461350 B     3/2011
JP      2006-350730 A    12/2006
(Continued)

*Primary Examiner* — Melissa J Koval
*Assistant Examiner* — Trung Q Nguyen
(74) *Attorney, Agent, or Firm* — Oblon, McClelland, Maier & Neustadt, L.L.P.

(57) ABSTRACT

According to one embodiment, a device for evaluating an energy storage device includes first processing circuitry and second processing circuitry. The first processing circuitry detects a plurality of times at which an amount of charge of the energy storage device satisfies a threshold condition, based on measurement data on the energy storage device in operation, selects a plurality of time intervals, calculates a charge-discharge efficiency in each of the time intervals based on charge-discharge command values belonging to the time interval, and divides a set of the charge-discharge efficiencies into a plurality of clusters and generates characteristic information on the clusters based on at least one of the measurement data and the charge-discharge command values. The second processing circuitry generates output data for displaying: transition data indicating transition of the charge-discharge efficiency belonging to the cluster; and characteristic information on the cluster.

18 Claims, 16 Drawing Sheets

(51) Int. Cl.
*G01R 31/374* (2019.01)
*H01M 10/42* (2006.01)
*G01R 31/382* (2019.01)

(58) Field of Classification Search
CPC ............. H01M 10/615; H01M 10/613; H01M
10/6567; H01M 10/63; H02J 3/386; H02J
3/381; H02J 3/383; H02J 2207/40
USPC ............... 324/400, 430, 433, 431, 500, 600,
324/764.01, 103 R, 771, 761.01, 501,
324/639, 642, 702, 76.11, 76.66, 96
See application file for complete search history.

(56) References Cited

U.S. PATENT DOCUMENTS

2007/0022065 A1    1/2007  Hatano et al.
2017/0031404 A1*  2/2017  Yamamoto ................ G06F 1/28

FOREIGN PATENT DOCUMENTS

| | | |
|---|---|---|
| JP | 4668015 B2 | 4/2011 |
| JP | 5017084 B2 | 9/2012 |
| JP | 6134438 B1 | 5/2017 |
| JP | 6313502 B2 | 4/2018 |

* cited by examiner

| TIME | CHARGE-DISCHARGE COMMAND VALUE [kW] | AMOUNT OF CHARGE [kWh] | TEMPERATURE [°C] |
|---|---|---|---|
| t1 | P1 | Q1 | T1 |
| t2 | P2 | Q2 | T2 |
| t3 | P3 | Q3 | T3 |
| ... | ... | ... | ... |
| ti | Pi | Qi | Ti |
| ... | ... | ... | ... |
| tj | Pj | Qj | Tj |
| ... | ... | ... | ... |
| tn | Pn | Qn | Tn |

FIG. 4

| TIME | CHARGE-DISCHARGE COMMAND VALUE [kW] | AMOUNT OF CHARGE [Ah] | TEMPERATURE [°C] |
|---|---|---|---|
| ... | ... | ... | ... |
| t(i) | P(i) | $Q(i) < \theta$ | T(i) |
| t(i+1) | P(i+1) | $Q(i+1) > \theta$ | T(i+1) |
| ... | ... | ... | ... |

FIG. 5

| TIME | CHARGE-DISCHARGE COMMAND VALUE [kW] | AMOUNT OF CHARGE [Ah] | TEMPERATURE [°C] |
|---|---|---|---|
| t1 | P1 (DISCHARGE) | Q1 | T1 |
| t2 | P2 (DISCHARGE) | Q2 (=⊖) | T2 |
| t3 | P3 (CHARGE) | Q3 | T3 |
| t4 | P4 (DISCHARGE) | Q4 | T4 |
| t5 | P5 (DISCHARGE) | Q5 (=⊖) | T5 |
| t6 | P6 (DISCHARGE) | Q6 | T6 |
| t7 | P7 (CHARGE) | Q7 (=⊖) | T7 |
| t8 | P8 (CHARGE) | Q8 | T8 |
| ... | ... | ... | ... |

TIME INTERVAL A

FIG. 7

DEVICE AND METHOD FOR EVALUATING ENERGY STORAGE DEVICE AND EVALUATION SYSTEM

CROSS REFERENCE TO RELATED APPLICATIONS

This application is based upon and claims the benefit of priority from the prior Japanese Patent Application No. 2019-000285, filed on Jan. 4, 2019, the entire contents of which are incorporated herein by reference.

FIELD

The present disclosure relate to a rechargeable battery evaluation device, a rechargeable battery evaluation method, and a rechargeable battery evaluation system.

BACKGROUND

Degradation of a rechargeable battery progresses due to long term use of a rechargeable battery and also repetition of charge and discharge. When the degradation of the rechargeable battery progresses, the capacity of the rechargeable battery is less than rated capacity. In order to keep high performance of battery systems, it needs to monitor the battery health constantly.

Methods of evaluating the degradation state of the rechargeable battery include a method of performing complete discharge and full charge over time, and of evaluating the degradation state of the rechargeable battery on the basis of the measurement result. There is also a method of performing measurement when continuous charge for a battery such as a battery provided in an EV (Electric Vehicle) and a mobile phone is performed, and of evaluating the degradation state of the rechargeable battery on the basis of the measurement result. These methods assume that special charge or discharge pattern is executed, or that the battery is made offline (the rechargeable battery is in a non-operation state).

On the other hand, there is also a voltage standard deviation method of performing evaluation based on the charge-discharge voltages of the rechargeable battery in a normal operation. Unfortunately, this method requires preliminary collection of data for associating the charge-discharge voltage standard deviation with the battery state of health. Accordingly, there is a problem in that preparation time is required until battery diagnosis is started.

BRIEF DESCRIPTION OF THE DRAWINGS

FIG. 4 shows an example of charge-discharge history data stored in a data storage;

FIG. 5 shows an example of identifying, by linear interpolation, a time when the amount of charge becomes a threshold "θ";

FIG. 7 shows a specific example of calculating the charge-discharge efficiency;

DETAILED DESCRIPTION

Figure 1:
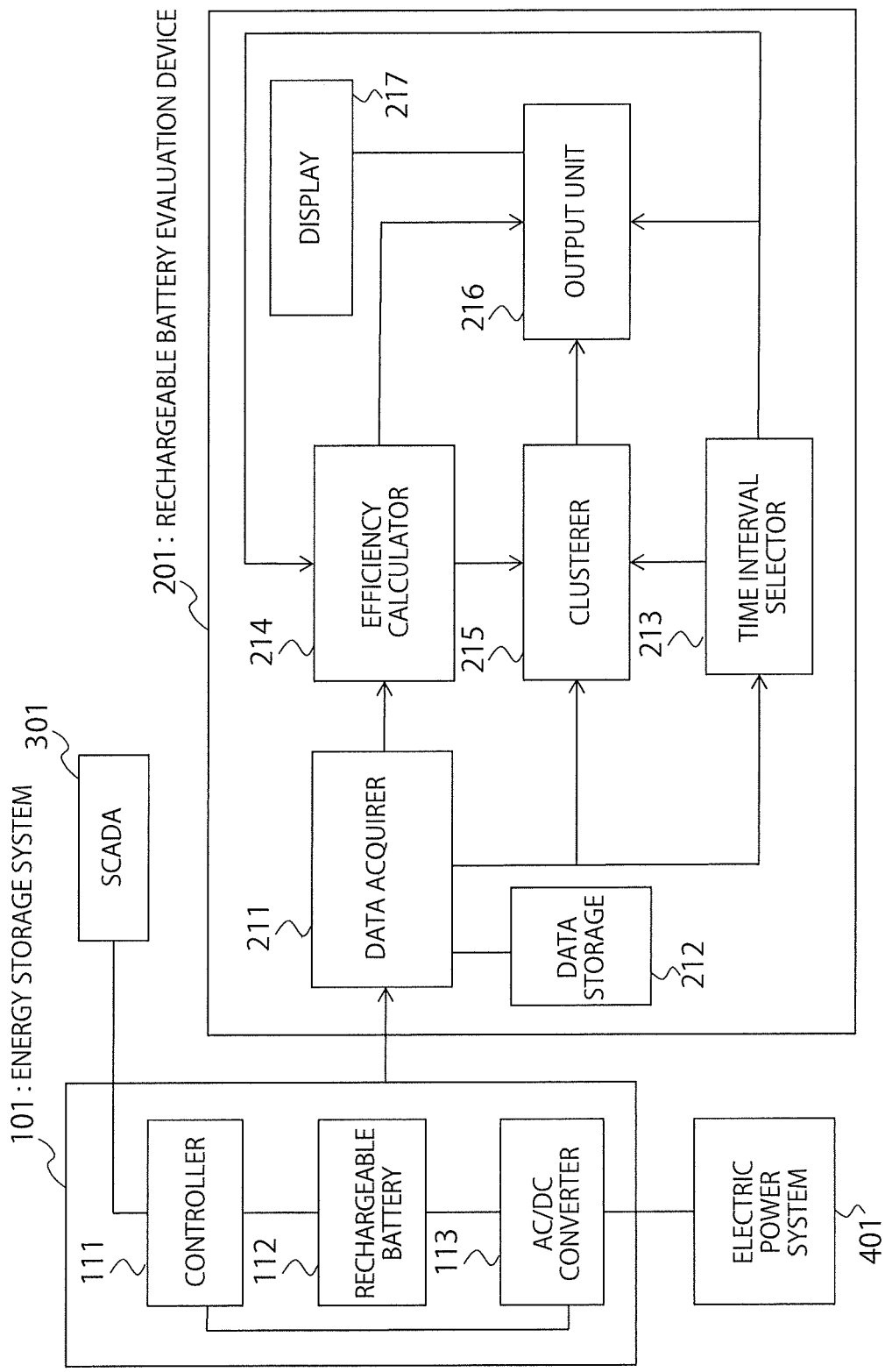
FIG. 1 is a block diagram of a basic configuration of a rechargeable battery evaluation system according to this embodiment.

According to one embodiment, a device for evaluating an energy storage device includes first processing circuitry and second processing circuitry.

The first processing circuitry detects a plurality of times at which an amount of charge of the energy storage device satisfies a threshold condition, based on measurement data on the energy storage device in operation, the energy storage device being configured to perform charge or discharge according to charge-discharge command values designating charge or discharge; selects a plurality of time intervals based on the plurality of times detected; calculates a charge-discharge efficiency in each of the time intervals based on charge-discharge command values belonging to the time interval; divides a set of the charge-discharge efficiencies into a plurality of clusters; and generates characteristic information on the clusters based on at least one of the measurement data and the charge-discharge command values.

The second processing circuitry generates output data for displaying: transition data indicating transition of the charge-discharge efficiency belonging to the cluster; and characteristic information on the cluster.

Hereinafter, referring to the drawings, the embodiments of the present invention are described.

FIG. 1 is a block diagram of a basic configuration of a rechargeable battery evaluation system according to this embodiment. The rechargeable battery evaluation system includes: an energy storage system (ESS) 101 that includes an evaluation-target rechargeable battery; and a rechargeable battery evaluation device 201 that evaluates the rechargeable battery. The rechargeable battery is also called a secondary battery. Hereinafter, this is called the rechargeable battery in a unified manner. The rechargeable battery corresponds to an example of an energy storage device.

The energy storage system 101 is connected to a SCADA 301 via a communication network. SCADA 301 (Supervisory Control And Data Acquisition) regards various energy storage systems (ESSs) residing in an area as a single large ESS, and transmits at least one of a charge command value and a discharge command value (hereinafter, a charge-discharge command value) to each ESS according to the time. The charge-discharge command value may include a charge-discharge execution time added thereto. In preliminarily temporally synchronized cases, a configuration without execution time added to the charge-discharge command value can be used. The SCADA 301 controls at least one of charge and discharge (hereinafter, charge-discharge) of each ESS for an electric power system 401. For example, the SCADA 301 controls charge and discharge of each ESS on the basis of a command from an upper-level energy management system, such as a power supply control center of an electric power company, a command from each energy management system on a lower-level electricity distribution side, or both of them.

The energy storage system 101 has a function of charging and discharging the rechargeable battery for the electric power system 401 according to the charge-discharge command value from the SCADA 301. The energy storage system 101 includes a controller 111, a rechargeable battery 112, and an AC/DC converter 113. The AC/DC converter 113 is connected to the electric power system 401. A transformer may be placed between the AC/DC converter 113 and the electric power system 401.

The controller 111 of the energy storage system 101 receives the charge-discharge command value from the SCADA 301, and generates an executable charge-discharge command value for the AC/DC converter 113 on the basis of the charge-discharge command value and the amount of charge of the rechargeable battery 112. For discrimination from the charge-discharge command value of the SCADA 301, for the sake of convenience, the charge-discharge command value generated by the controller 111 is sometimes called a charge-discharge instruction. The controller 111 controls the AC/DC converter 113 on the basis of the generated charge-discharge instruction, and charges and discharges the rechargeable battery 112.

The AC/DC converter 113 connects the electric power system 401 and the rechargeable battery 112 to each other, and has a function of bidirectionally converting AC electric power in the electric power system 401 and DC electric power in the rechargeable battery 112. The AC/DC converter 113 may have a configuration of including a single AC/DC converter, or a configuration of connecting converters of two or more types among an AC/DC converter, a DC/DC converter, and an AC/AC converter. The AC/DC converter 113 outputs a discharge instruction or a charge instruction to the rechargeable battery 112 according to the charge-discharge instruction provided from the controller 111. Accordingly, the rechargeable battery 112 is charged and discharged.

The rechargeable battery 112 is a rechargeable battery that can accumulate (be charged with) and discharge electric energy. The electric energy accumulated in the rechargeable battery 112 is called an amount of charge or a charge amount.

The rechargeable battery 112 includes one or more battery string. Each battery string includes, for example, one or more battery modules, and one BMU (Battery Management Unit: battery manager). Each battery module includes multiple unit batteries (cells).

Upon receipt of the discharge instruction from the AC/DC converter 113, the rechargeable battery 112 discharges the electric power accumulated in the cells to the AC/DC converter 113. Upon receipt of the charge instruction from the AC/DC converter 113, the rechargeable battery 112 charges the cells with the electric power supplied from the electric power system 401. Each of the cell, the battery module, the battery string, and the rechargeable battery 112 is a mode of an energy storage device, which internally accumulates electric energy.

Hereinafter, a configuration example of the rechargeable battery 112 is described in detail.

Figure 2:
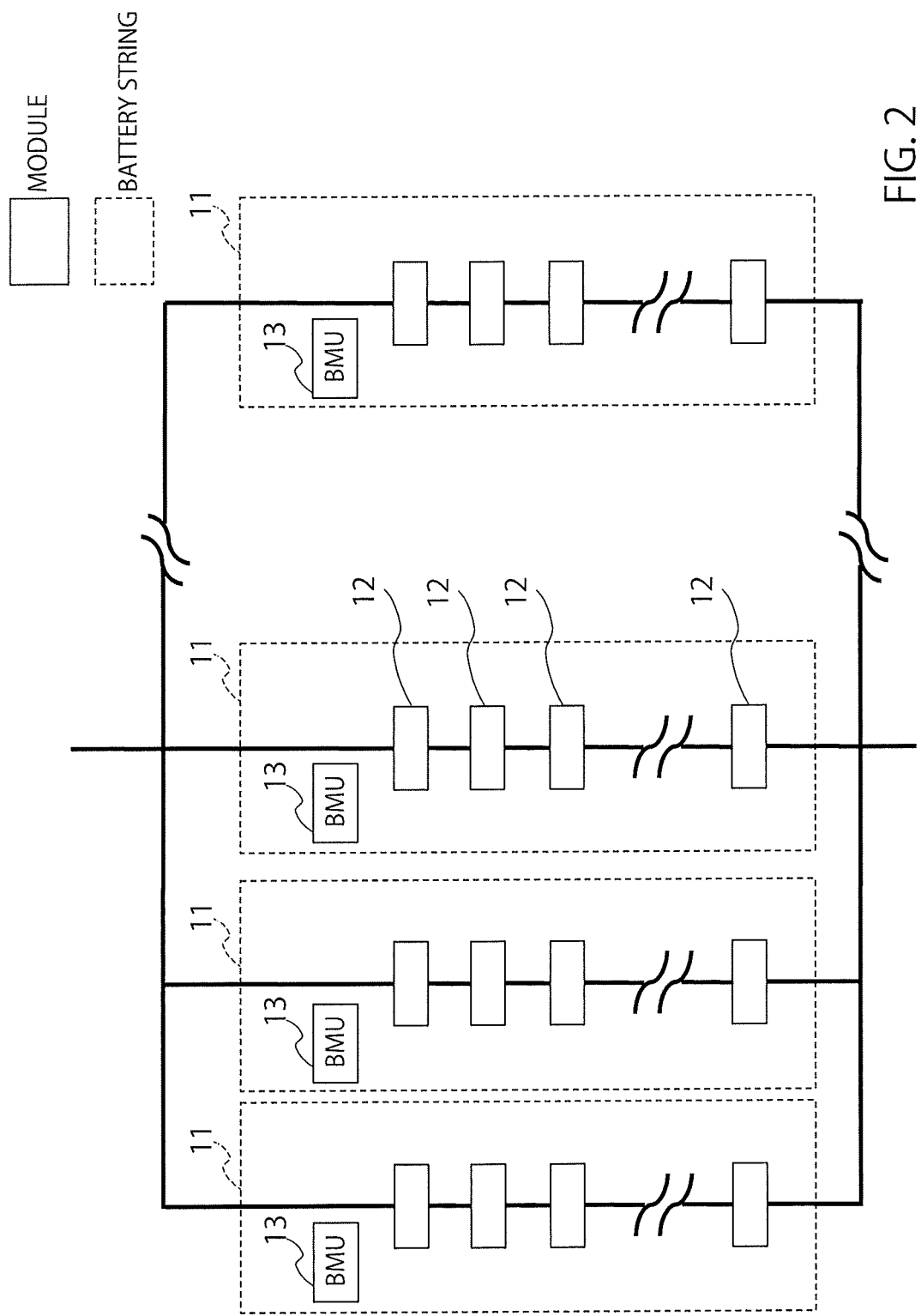
FIG. 2 shows a configuration example of a rechargeable battery.

FIG. 2 shows a configuration example of the rechargeable battery 112. The rechargeable battery 112 includes a battery array where multiple battery strings 11 are connected in parallel. In each battery string 11, multiple battery modules 12 are connected in series. Each battery string 11 includes a BMU 13. The multiple battery modules 12 may be connected in parallel. Alternatively, the multiple battery modules 12 are connected in series and parallel. Multiple battery strings may be connected in series or in series and parallel. The BMU 13 may include a communicator that transmits and receives information to and from the rechargeable battery evaluation device 201. The communicator may be disposed in the battery string 11, or be disposed out of the battery string 11.

Figure 3:
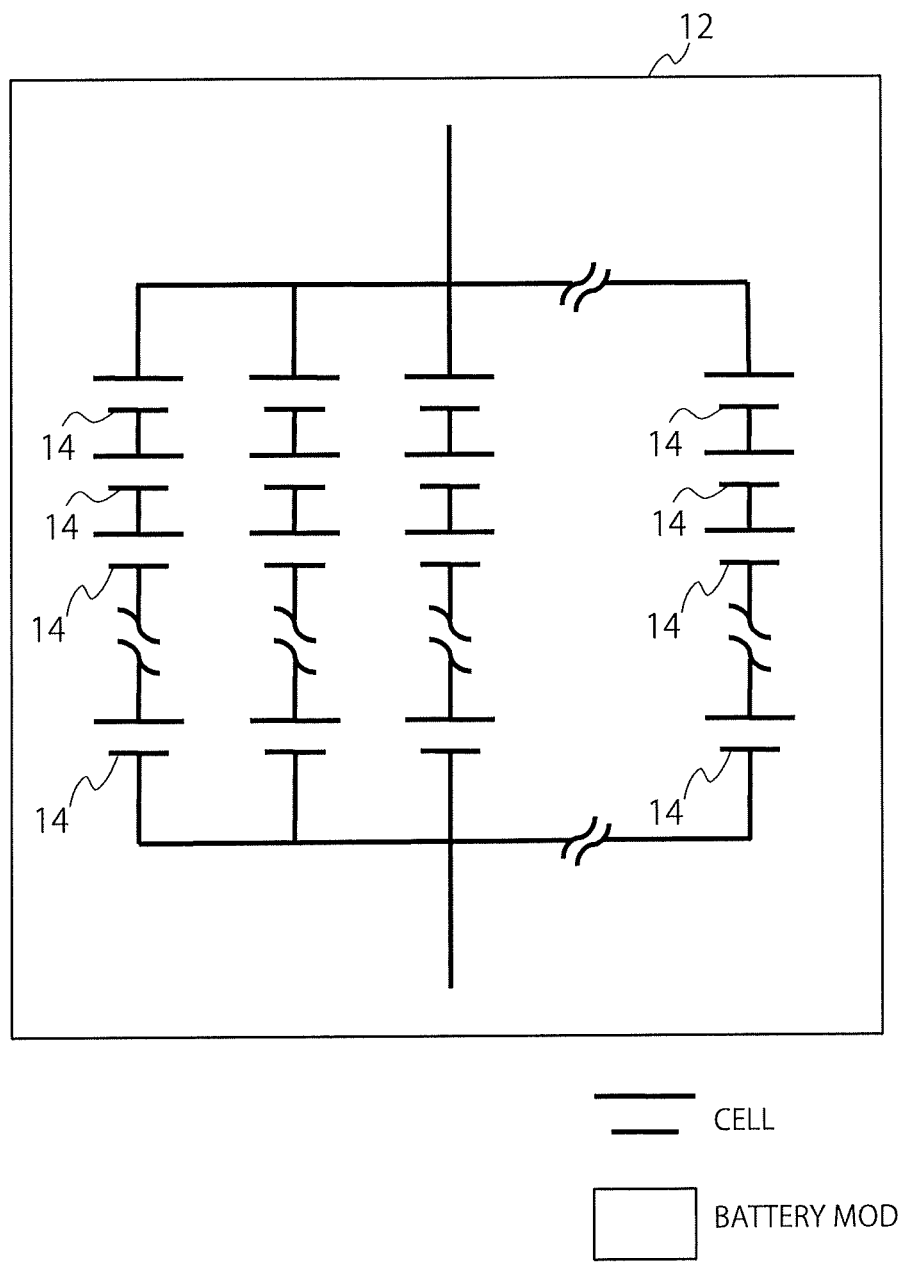
FIG. 3 shows an example of a configuration of a battery module.

FIG. 3 shows an example of a configuration of each battery module 12. The battery module 12 includes multiple cells 14 connected in series and parallel. A configuration where multiple cells 14 are connected in series, a configuration of being connected in parallel, and a configuration where a series connection and a parallel connection are combined can be used. The battery module 12 may include one CMU (Cell Monitoring Unit: cell monitor). Each cell 14 is chargeable and dischargeable unit battery. Examples include a lithium-ion battery, lithium-ion polymer battery, lead storage battery, nickel-cadmium battery, and nickel-hydrogen battery.

A measuring device (not shown) that measures parameters, such as the voltage, current, and temperature, is disposed for each cell 14. Likewise, a measuring device (not shown) that measures parameters, such as the voltage, current, and temperature of the battery module, is disposed for each battery module 12. Furthermore, a measuring device (not shown) that measures parameters, such as the voltage, current, and temperature of the battery string, is disposed for each battery string 11. Furthermore, a measuring device (not shown) that measures parameters, such as the voltage, current, and temperature of the battery array, is disposed for each battery array. Here, the measuring device, which measures the voltages, currents, temperatures and the like, is thus disposed for all the cells, the battery modules, the battery strings, and the battery array. Alternatively, the measuring devices may be disposed only for some types of them. Alternatively, the measuring device may be disposed only for some cells to be diagnosed, instead of all the cells. This is also applied for the energy storage devices (battery modules and battery strings) other than the cells. Each measuring device may measure not only the voltage, current and temperature but also another parameter, such as humidity. The sampling frequency of the measuring device may be higher than or identical to the reception frequency of the charge-discharge command value.

The rechargeable battery transmits measurement data on the rechargeable battery to the rechargeable battery evaluation device 201. The measurement data includes parameters (the voltage, current, temperature, etc.) measured by the measuring device, and the measurement time. The measurement time may be acquired by preliminarily arranging a clock in the rechargeable battery 112 or the energy storage system 101, and acquiring the time on the clock as the measurement time when acquiring the parameters. Alternatively, a clock may be provided in the rechargeable battery evaluation device 201. When the rechargeable battery evaluation device 201 acquires the measurement data from the energy storage system 101, this device may associate the acquired measurement data with the time on the clock. In this case, the measurement data does not necessarily include the measurement time. In this embodiment, an example where the rechargeable battery 112 is used as the evaluation target is described. The evaluation of the rechargeable battery 112 described here is evaluation of an collection of all the battery cells included in the rechargeable battery 112, and is different from evaluation of the measuring device, evaluation of a cell monitor, and evaluation of a controller included in the rechargeable battery. In this embodiment, any hierarchic level from an individual cell to a hierarchic structure of a collection including multiple cells can be evaluated as long as a measurement value can be taken. The evaluation of the energy storage device according to this embodiment corresponds to evaluation of a collection of battery cells from which measurement values can be taken, such as a cell, a battery module (in actuality, a collection of cells included in the battery module), a battery string (in actuality, a collection of cells included in the battery string).

The rechargeable battery evaluation device 201 includes a data acquirer 211, a data storage 212, a time interval selector 213, an efficiency calculator 214, a clusterer 215, an output unit 216, and a display 217.

The data acquirer 211 acquires measurement data on the rechargeable battery from the energy storage system 101. Furthermore, the data acquirer 211 acquires the charge-discharge command value (the charge-discharge execution time is added thereto) from the controller 111 of the energy storage system 101. The charge-discharge command value described here corresponds to the charge-discharge command value (the charge-discharge instruction described above) which the controller 111 generates based on the charge-discharge command value of the SCADA and the amount of charge of the rechargeable battery 112. The data acquirer 211 may acquire the measurement data and the charge-discharge command value every constant time period. The data acquirer 211 stores the acquired measurement data and charge-discharge command value in the data storage 212.

The data storage 212 internally stores charge-discharge history data which includes the measurement data and charge-discharge command value acquired by the data acquirer 211.

FIG. 4 shows an example of the charge-discharge history data stored in a data storage 212. From time "t1" to "tn", the charge-discharge command value, the temperature of the rechargeable battery, and the amount of charge of the rechargeable battery are stored. The time "t1" to "tn" each corresponds to a sample time. In this embodiment, the execution time of the charge-discharge command value and the parameter measurement time coincide with each other.

"P1," "P2," ..., "Pn" are charge-discharge command values. "P1," "P2," ..., "Pn" are signed numeric values. For example, a positive value indicates an instruction of discharge, and a negative value indicates an instruction of charge. However, the signs may be inverted.

"Q1," "Q2," ..., "Qn" represent charge amounts (amounts of charge) accumulated in the rechargeable battery 112. Discharge of the rechargeable battery 112 reduces the amount of charge of the rechargeable battery 112. Charge of the rechargeable battery 112 increases the amount of charge of the rechargeable battery. The ratio acquired by dividing the electric energy by the rated capacity, i.e., the maximum amount of charge before degradation, is called absolute SOC (State of Charge). In this paper, absolute SOC is written as "SOC." The amount of charge may be represented by SOC.

"T1," "T2," ... "Tn" represent temperatures of the rechargeable battery 112.

For example, data at time "t2" includes a charge-discharge command value "P2," an amount of charge "Q2" and a temperature "T2." This means that the charge and discharge for the charge-discharge command value "P2" are executed at time "t2" and resultantly the amount of charge of the rechargeable battery 112 becomes "Q2," and the temperature of the rechargeable battery 112 at this time is "T2." Data at another time is interpreted in an analogous manner.

The time interval selector 213 searches for a time when the amount of charge satisfies a threshold condition, on the basis of the charge-discharge history data stored in the data storage 212. For example, the search is performed in a temporal range from a preliminarily provided search start time to a search finish time. The threshold condition is that the amount of charge reaches a threshold "θ", for example. The amount of charge reaching the threshold "θ" includes a case where the amount of charge reaches the threshold "θ" from a value larger than the threshold "θ," and a case where the amount of charge reaches the threshold "θ" from a value less than the threshold "θ." Another example of the threshold condition may include that the amount of charge enters a certain range (for example, a range from "θ-L" to "θ+M," inclusive) with reference to the threshold, that is, a case where the amount of charge enters the certain range from the outside of the certain range. Any condition other than that described here may be used only if the condition is based on the threshold.

Hereinafter, assumption is made that the threshold condition is that the amount of charge reaches the threshold "θ." In this case, a time when the amount of charge satisfies the threshold condition is a time when the amount of charge reaches the threshold "θ", for example. If the time when the amount of charge reaches the threshold "θ" coincides with the sample time, the sample time is the time when the amount of charge reaches the threshold "θ." If the time when the amount of charge reaches the threshold "θ" is between sample times, the time when the amount of charge reaches the threshold "θ" can be calculated by linear interpolation. Alternatively, a sample time immediately after (immediately before) the amount of charge reaches the threshold "θ" may be used as the time when the amount of charge reaches the threshold "θ."

Hereinafter referring to FIGS. 5 and 6, an example of identifying the time when the amount of charge becomes a threshold "θ" by linear interpolation is described.

FIG. 5 shows an example of the charge-discharge history data in a case where the amount of charge at time "t(i)" is smaller than the threshold "θ" and the amount of charge at the next time "t(i+1)" is larger than the threshold "θ." The time when the amount of charge reaches the threshold "θ" can be calculated as $$t = (1-\alpha)t(i) + \alpha t(i+1),$$

where, $\alpha = (\theta - Q(i))/(Q(i+1) - Q(i))$.

Figure 6:
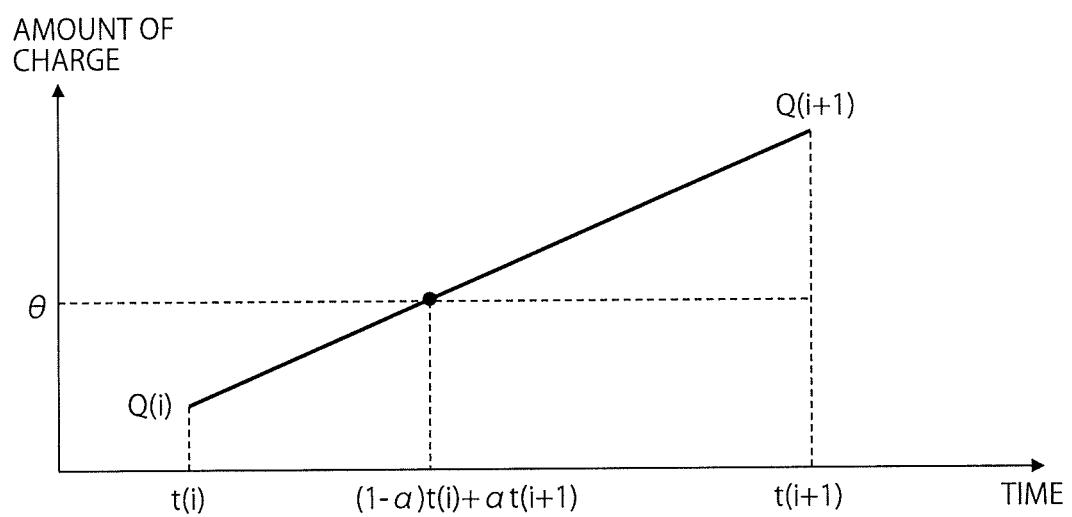
FIG. 6 shows an example of identifying, by linear interpolation, a time when the amount of charge becomes a threshold "θ"

FIG. 6 shows an example of a graph of a line on which data items at times t(i) and t(i+1) are mapped on a coordinate system having an abscissa axis of time and an ordinate axis of amount of charge and which passes the mapped coordinates. The point at which the graph of the line intersects with the line of threshold "θ" is the time when the amount of charge reaches the threshold "θ."

The charge-discharge command value at the time when the amount of charge reaches the threshold "θ" can be acquired also by linear interpolation as follows.

$$(1-\alpha)P(i)+\alpha P(i+1).$$

Likewise, the temperature at the time when the amount of charge reaches the threshold "θ" can be acquired also by linear interpolation as follows.

$$(1-\alpha)T(i)+\alpha T(i+1).$$

In a case where a sample time immediately after the amount of charge reaches the threshold "θ" is regarded as the time when the amount of charge reaches the threshold "θ," the time "t(i+1)" is the time when the amount of charge reaches the threshold "θ" in the example in FIG. 5. The charge-discharge command value and the temperature at this time are P(i+1) and T(i+1), respectively.

The value of the threshold "θ" may be preliminarily provided, or be a value acquired by adjusting the preliminarily provided value of the threshold. The threshold "θ" to be used may be determined by selection among preliminarily provided threshold candidates.

The time interval selector 213 chronologically arranges the times detected by search. The time interval selector 213 selects intervals of times satisfying an extraction condition. The selected intervals correspond to time intervals. The time intervals are herein assumed not to overlap each other (the same interval is not shared). However, overlap may be allowed.

Here, the extraction condition is specifically described. It is assumed that a time when the amount of charge Q satisfies the threshold condition is identified between a first time and a second time.

First Example

If the time difference between the first time and the second time is equal to or longer than a value "Δta," the extraction condition is satisfied. In this case, the interval between the first time and the second time is selected as the time interval. If the time difference is less than the time period "Δta," the extraction condition is not satisfied. In this case, the time interval is not selected. The number of data samples may be used as the time difference. In this case, if the number of data samples is equal to or larger than a predetermined value "n," the extraction condition is satisfied. If the number is less than the predetermined value "n," the extraction condition is not satisfied.

Second Example

If the sum of lengths of times during the charge-discharge command value is "0" between the first time and the second time is equal to or less than a value "Δtb," the extraction condition is satisfied. As an example of a case where the charge-discharge command value is "0," the charge-discharge command value from the SCADA 301 is "0," and the charge-discharge command value (charge-discharge instruction) generated by the controller 111 is also "0" accordingly. There is another example where the controller 111 generates the charge-discharge command value of "0," for a charge command when the rechargeable battery 112 is in the full charge state and cannot be charged any more even though the charge-discharge command value from the SCADA 301 is not "0." Similarly, there is also another example where the controller 111 generates the charge-discharge command value of "0," for a discharge command when the rechargeable battery 112 is in the complete discharge state and cannot be discharged any more even though the charge-discharge command value from the SCADA 301 is not "0." As described above, if the sum of lengths of the times where the charge-discharge command value is "0" is equal to or shorter than the value "Δtb," the interval between the first time and the second time is selected as the time interval. If the length is equal to or longer than the value "Δtb," the extraction condition is not satisfied. In this case, the time interval is not selected.

Third Example

If the difference between the mean value "μQ" of amounts of charge between the first time and the second time and the threshold "θ" is equal to or less than a value "h," the extraction condition is satisfied. In this case, the interval between the first time and the second time is selected as the time interval. If the difference is less than the value "h," the extraction condition is not satisfied. In this case, the time interval is not selected.

Fourth Example

Two or more of the extraction conditions in the first to third examples are combined. Only when all the combined extraction conditions are satisfied, the interval between the first time and the second time is selected as the time interval. When at least one of the combined extraction conditions is not satisfied, the interval between the first time and the second time is not selected.

The efficiency calculator 214 calculates the total sum of the discharge command values and the total sum of the charge command values for each of the time intervals selected by the time interval selector 213. The efficiency calculator 214 calculates the charge-discharge efficiency as an evaluation indicator on the basis of the ratio of the total sum of the discharge command values to the total sum of the charge command values.

Referring to FIG. 7, a specific example of calculating the charge-discharge efficiency is described. FIG. 7 shows a part of charge-discharge history data. According to the sign of the charge-discharge command value, the charge-discharge command values "P1," "P2," "P4," "P5" and "P6" are discharge instructions, and "P3," "P7" and "P8" are charge instructions. "t2," "t5" and "t7" are identified as times when the amount of charge satisfies the threshold condition. The interval between the time "t2" and "t7" among them satisfies the extraction condition. Accordingly, this interval is selected as the time interval "A." The interval between the time "t5" and "t7" does not satisfy the extraction condition. Accordingly, this interval is not selected as the time interval.

In this case, the total sum of amounts of discharge indicated by the discharge command value in the time interval "A" is as follows.

$$|P2|(t2-t1)+|P4|(t4-t3)+|P5|(t5-t4)$$

The total sum of amounts of charge indicated by the charge command value in the time interval "A" is as follows.

$$|P3|(t3-t2)+|P6|(t6-t5)+|P7|(t7-t6)$$

Consequently, the charge-discharge efficiency "rA" in the time interval "A" is calculated by the following expression.

Charge–discharge efficiency $rA=(|P2|(t2-t1)+|P4|(t4-t3)+|P5|(t5-t4))/(|P3|(t3-t2)+|P6|(t6-t5)+|P7|(t7-t6))$ The higher the charge-discharge efficiency "rA" is, the higher the use efficiency of the rechargeable battery is.

Figure 8:
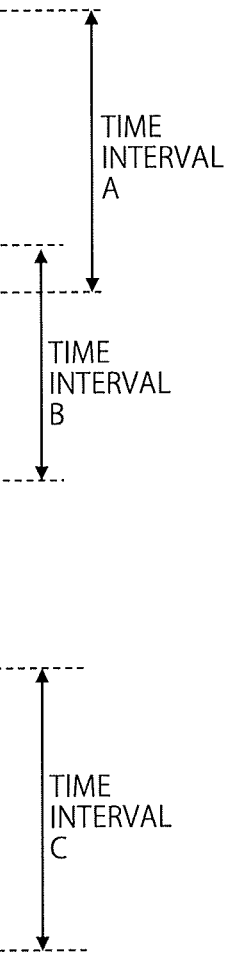
FIG. 8 shows another example of charge-discharge history data.

FIG. 8 shows another example of the charge-discharge history data. The data from time "t1" to "t8" is the same as that in FIG. 7. The charge-discharge history data in FIG. 8 includes data from time "t9" to "t22" in addition to the data in FIG. 7. From "t13" to "t15", charge or discharge is not designated (the charge-discharge command value is "0"). In addition to times "t2," "t5" and "t7," times "t11," "t16" and "t21" are detected as times when the amount of charge satisfies the threshold condition. Based on the times, the time interval "A(t2–t7)," the time interval "B(t7–t11)" and the time interval "C(t16–t21)" are selected because the extraction condition is satisfied.

For the time interval "A," the charge-discharge efficiency "rA" is calculated by the calculation method described above. Also for the time interval "B" and the time interval "C," the charge-discharge efficiency "rB" and the charge-discharge efficiency "rC" are respectively calculated by a method analogous to that of the time interval "A."

Figure 9:
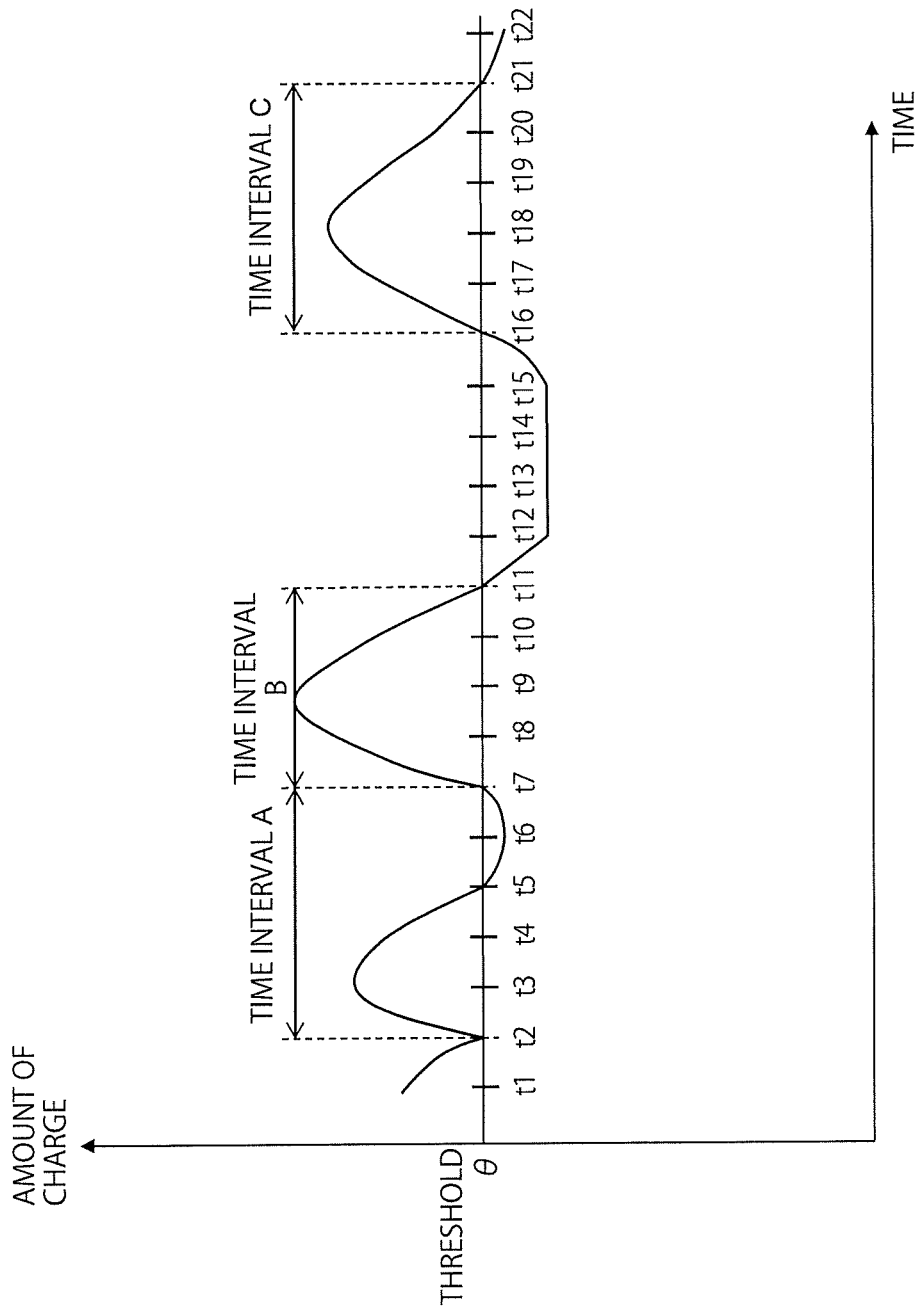
FIG. 9 shows an example of graph representation by depicting charge-discharge history data in FIG. 8 on a coordinate system having an abscissa axis of time and an ordinate axis of amount of charge.

FIG. 9 shows an example of graph representation by depicting the charge-discharge history data in FIG. 8 on a coordinate system having an abscissa axis of time and an ordinate axis of amount of charge. A time at which the graph intersects with the threshold "θ" corresponds to the time at which the amount of charge satisfies the threshold condition. The time intervals "A," "B" and "C" identified for the charge-discharge history data in FIG. 8 are represented.

The output unit 216 generates data associating the charge-discharge efficiency acquired from the efficiency calculator 214 with the time (representative time) representing the time interval. The representative time is, for example, a finish time of the time interval from which the charge-discharge efficiency has been calculated. The data is represented as (the representative time and the charge-discharge efficiency), for example. The output unit 216 plots the data on a coordinate system having axes of time and charge-discharge efficiency. The display 217 displays, on the screen, a set of the data items plotted on the coordinate system, i.e., transition data on the charge-discharge efficiency. Note that instead of the output unit 216 generating the data, the clusterer 215 described later may generate the data, add cluster identification information or cluster characteristic information to the generated data, and provide the resultant data for the output unit 216.

In the case of the charge-discharge history data in FIG. 8, the output unit 216 associates the charge-discharge efficiencies "rA," "rB" and "rC" calculated for the time intervals "A," "B" and "C" with the respective representative times "tA," "tB" and "tC", and thereby generates data items "(tA, rA)," "(tB, rB)" and "(tC, rC)". The output unit 216 plots these data items on a coordinate system having axes of time and charge-discharge efficiency.

Figure 10:
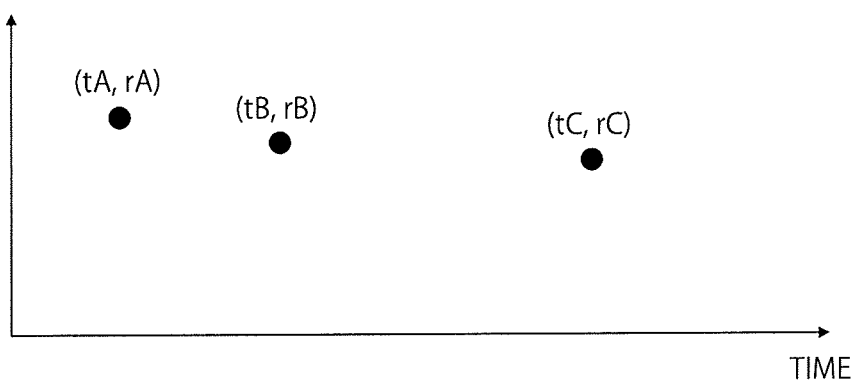
FIG. 10 shows an example where data is plotted on a coordinate system having axes of time and charge-discharge efficiency.

FIG. 10 shows an example where these data items are plotted on the coordinate system having the axes of time and charge-discharge efficiency. "tA," "tB" and "tC" are finish times of the time intervals for which the charge-discharge efficiencies "rA," "rB" and "rC" are calculated, respectively. That is, "tA," "tB" and "tC" are "t7," "t11" and "t21," respectively.

Instead of the charge-discharge efficiencies being associated with the representative times, the charge-discharge efficiencies are associated with the accumulated amount of discharge or the accumulated amount of charge from a start of use of the rechargeable battery 112 to the finish times of the time intervals, and thereby the data items may be generated. In this case, the data items may be plotted on a coordinate system having axes of the charge-discharge efficiency and the accumulated amount of discharge or the accumulated amount of charge from the start of use of the rechargeable battery.

The clusterer 215 clusters the set of data items plotted on the coordinate system described above, and divides the set of the data items into multiple clusters. For example, a generally known hierarchical method or condensation method can be used as the clustering method. The hierarchical method is a method of dividing points in a top-down manner. The condensation method is a method of integrating clusters preliminarily subdivided by any method. Alternatively, the clustering method disclosed in Japanese Patent publication No. 2006-350730 may be used. The clustering method described in this publication allows clustering similar to human intuition. The clustering method used in this embodiment is not limited to a specific one. Alternatively, any method can be used.

Figure 11:
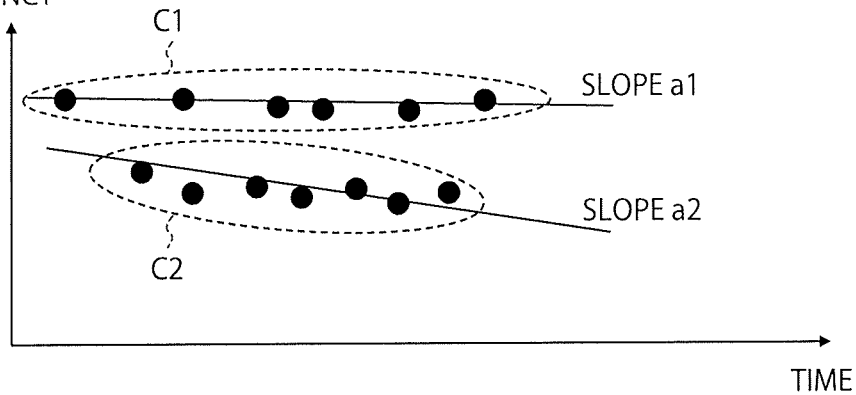
FIG. 11 shows an example of clustering.

FIG. 11 schematically shows an example of clustering. In this example, the abscissa axis indicates the time. Alternatively, a case where the abscissa axis indicates the accumulated amount of discharge or the accumulated amount of charge can be used. Thirteen data items are plotted on the depicted coordinate system. The clusterer 215 clusters the set of data items. As a result, two clusters "C1" and "C2" are generated. The clusterer 215 calculates a function (approximation function) approximating the cluster for each of the clusters "C1" and "C2." Graphs of the approximation functions calculated for the respective clusters are depicted. In this example, each cluster is approximated by a liner function (line). Alternatively, the cluster may be approximated by a higher-order function. In this case, the approximation function can be a curve (a curved graph). The data items belonging to each cluster, or the graph of the function approximating each cluster corresponds to transition data indicating transition of charge-discharge efficiencies of the corresponding cluster. The slopes of linear functions approximating the clusters "C1" and "C2" are "a1" and "a2," respectively. Information on these slopes are displayed on the display 217. As information identifying the clusters "C1" and "C2" (cluster identification information), and frames encircling the respective clusters may be displayed. The colors of data items belonging to the clusters "C1" and "C2" may be changed on a cluster-by-cluster basis, or background colors of the clusters "C1" and "C2" may be changed on a cluster-by-cluster basis.

The clusterer 215 generates characteristic information on each cluster (cluster characteristic information). The cluster characteristic information is calculated from information of the points (data items) belonging to the cluster, for example. The clusterer 215 displays the generated cluster characteristic information on a screen identical to the screen for the set of the plotted data items or on another screen. It can be said that data acquired under a common use condition of the rechargeable battery (for example, data having a similar factor, such as the battery temperature, charge-discharge command value, or SOC) in each cluster belongs to the corresponding cluster. That is, it can be said that the cluster characteristic information represents the use condition of the rechargeable battery 112 that is common when the data items belonging to the cluster are acquired. The information on slope and the information identifying the cluster described above (cluster identification information) are examples of the cluster characteristic information. Other examples of generating the cluster characteristic information are described.

According to a first example, the standard deviation of charge-discharge command values is calculated for each data item belonging to the cluster. That is, the standard deviation of the charge-discharge command values included in the time interval from which each data item has been calculated, is calculated. The statistical information (the mean, median, maximum value, minimum value, etc.) on the standard deviations is used as the cluster characteristic information on the cluster. The cluster characteristic information on the cluster "C1" may be the mean value of the standard deviations of the charge-discharge command values. The cluster characteristic information on the cluster "C2" may be the mean value of the standard deviations of the charge-discharge command values. Instead of the standard deviation of the charge-discharge command values, another value, such as the mean value of the charge-discharge command values or the variance of the charge-discharge command values may be calculated, and the statistical information on the calculated value may be used as the cluster characteristic information. In FIG. 11, the number of clusters is two. Alternatively, the number of clusters may be three or more.

According to a second example, the standard deviation of the temperatures included in the time interval from which each data item has been calculated, is calculated for each data item belonging to the cluster. The statistical information (the mean, median, maximum value, minimum value, etc.) on the standard deviations is used as the cluster characteristic information on the cluster. Instead of the standard deviation of the temperatures, another value, such as the mean value of the temperatures or the variance of the temperatures may be calculated, and the statistical information on the calculated value may be used as the cluster characteristic information.

According to a third example, the standard deviation of the amounts of charge (charge amounts) included in the time interval from which each data item has been calculated, is calculated for each data item belonging to the cluster. The statistical information (the mean, median, maximum value, minimum value, etc.) on the standard deviations is used as the cluster characteristic information on the cluster. Instead of the standard deviation of the amounts of charge, another value, such as the mean value of the amounts of charge or the variance of the amounts of charge may be calculated, and the statistical information on the calculated value may be used as the cluster characteristic information.

According to a fourth example, the statistical information such as standard deviation of the interval lengths of the time intervals from which the data items has been calculated, is calculated for the data items belonging to the cluster. The statistical information is used as the cluster characteristic information on the cluster. Instead of the standard deviation of the interval lengths, another value, such as the mean value, the variance, the mean, the median, the maximum value or the minimum value of the interval lengths may be calculated, and the statistical information on the calculated value may be used as the cluster characteristic information.

The cluster characteristic information described above is only an example. Alternatively, the information may be other information as long as the information is based on at least one of the charge-discharge command value, the amount of charge, the temperature and the time, etc.

An operator of the rechargeable battery evaluation device 201 can grasp the efficient use condition of the rechargeable battery allowing a favorable charge-discharge by referring to the screen displayed on the display 217. The example in FIG. 11 illustrates that the charge-discharge efficiency of the cluster "C1" is higher than that of the cluster "C2." The slope "a1" of the approximate line of the cluster "C1" is gentler than the slope "a2" of the approximate line of the cluster C2. Consequently, it can be determined that the cluster "C1" has a lower speed of degradation. Accordingly, it can be determined that the operator can improve the efficiency of charge and discharge by charge and discharge according to the cluster characteristic information or a condition similar thereto as the use condition of the rechargeable battery 112, and can also suppress the progress of degradation of the rechargeable battery 112.

Information identifying such a use condition of the rechargeable battery may be transmitted by an instruction by the operator from the rechargeable battery evaluation device 201 or another user device to a server of the electric power system 401. The server may generate the charge-discharge command value so as to improve the charge-discharge efficiency, on the basis of this information. For example, the cluster characteristic information on the cluster "C1" may be transmitted from the rechargeable battery evaluation device 201 to the server. The server may generate the charge-discharge command value so as to satisfy the cluster characteristic information.

Figure 12:
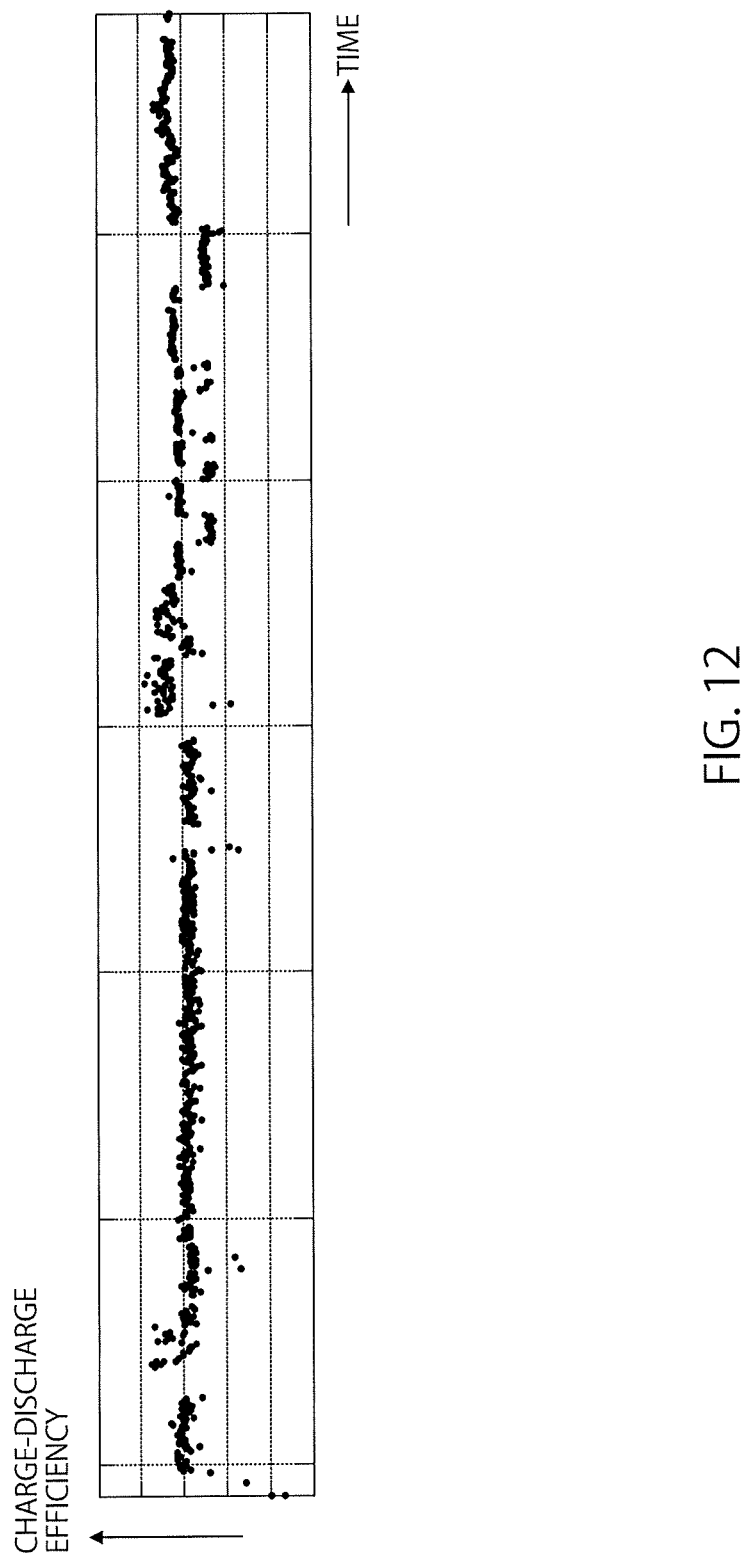
FIG. 12 shows an example of plotting data acquired over a long measurement period.

FIG. 12 shows an example where data items based on a measurement period longer than that of the example in FIG. 10 or 11 are plotted. The abscissa axis indicates time, and the ordinate axis indicates the charge-discharge efficiency.

Figure 13:
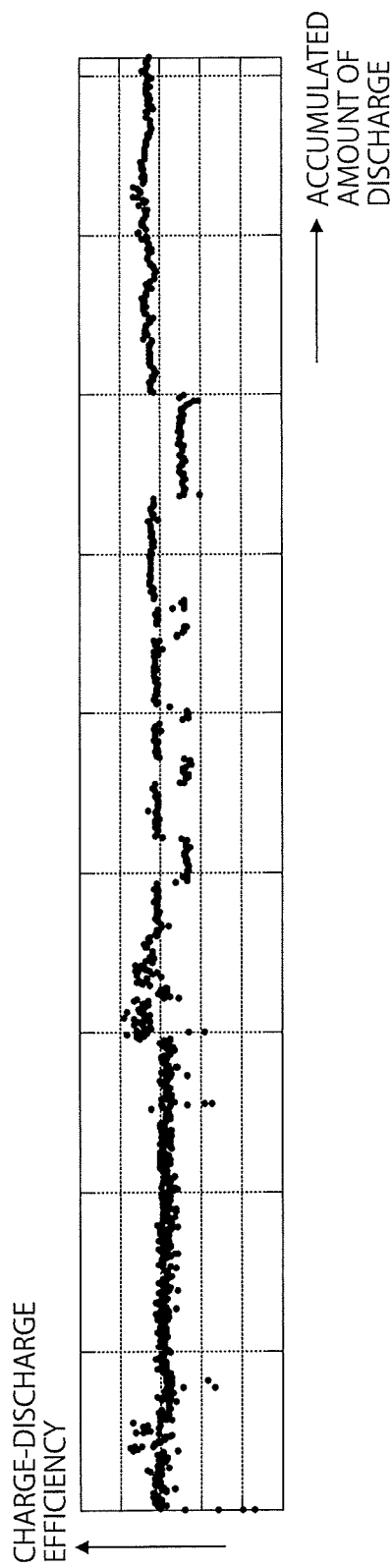
FIG. 13 shows another example of plotting data acquired over a long measurement period.

FIG. 13 shows an example where data items based on a measurement period longer than that of the example in FIG. 10 or 11 are plotted. Unlike FIG. 11, the abscissa axis indicates the accumulated amount of discharge, and the ordinate axis indicates the charge-discharge efficiency.

In FIG. 12 or 13, data items more than those in FIG. 10 or 11 are plotted. In any of the cases, multiple clusters are generated by clustering the data according to a method analogous to that described with reference to FIG. 11. The function approximating the cluster is calculated and the cluster characteristic information is generated, for each of the generated clusters.

In the embodiment described above, the number of thresholds "θ" is one. Alternatively, the number of thresholds "θ" may be two or more. In a case of using multiple thresholds "θ," data items are plotted and clustered for each of the thresholds "θ." In this case, the value of the threshold "θ" may be included as a part of the cluster characteristic information, and be displayed on the display 217. Accordingly, the operator can also grasp the tendency of the relationship between the threshold "θ" and the charge-discharge efficiency.

Figure 14:
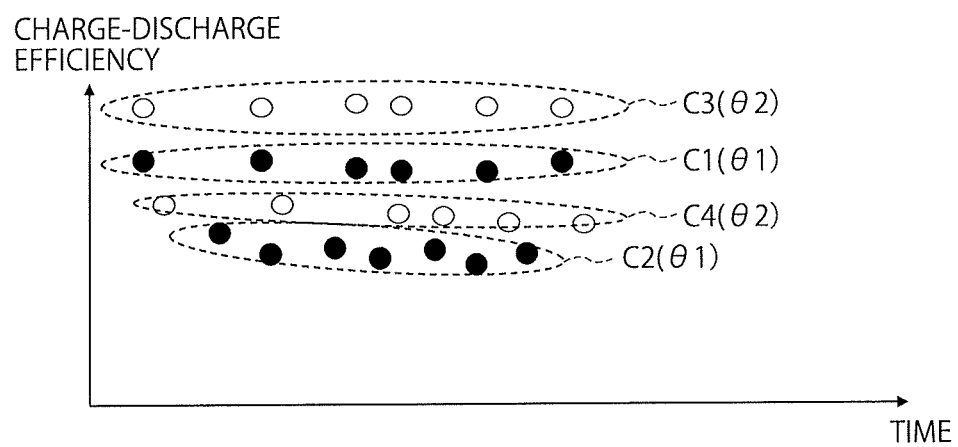
FIG. 14 shows an example of a screen displayed in cases of using two thresholds.

FIG. 14 schematically shows an example of a screen displayed in cases of using two thresholds "θ1" and "θ2" as the thresholds "θ." In the case of using the threshold "θ1," the clusters "C1" and "C2" are generated. In the case of using the threshold "θ2," the clusters "C3" and "C4" are generated. Note that in FIG. 14, display of the other information, such as the slope of the approximate line, is omitted.

Figure 15:
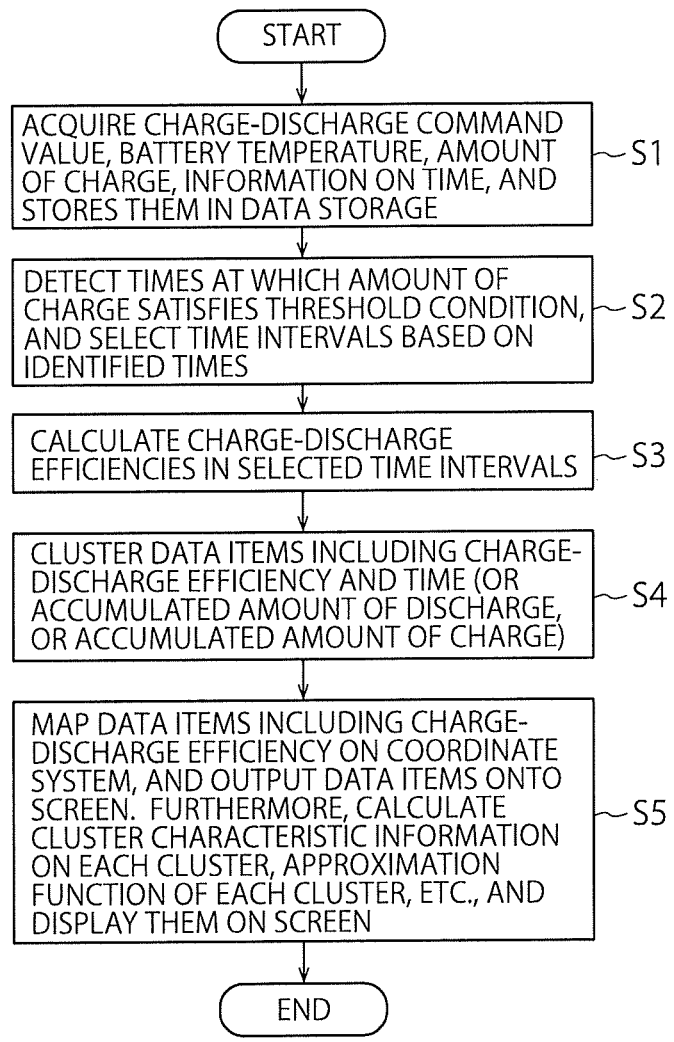
FIG. 15 is a flowchart of an operation example of a rechargeable battery evaluation device according to this embodiment.

FIG. 15 is a flowchart of an operation example of the rechargeable battery evaluation device 201 according to this embodiment.

In step S1, the data acquirer 211 acquires the charge-discharge command value, and the measurement data (the battery temperature, amount of charge, measurement time, etc.), and stores the acquired charge-discharge command value and measurement data as the charge-discharge history data in the data storage 212.

In step S2, the time interval selector 213 detects times satisfying the threshold condition in the charge-discharge history data. The time interval selector 213 selects the intervals of times satisfying the extraction condition on the basis of the time detected, as time intervals.

In step S3, the efficiency calculator 214 calculates the charge-discharge efficiencies in the selected time intervals.

In step S4, the clusterer 215 clusters the data items including the charge-discharge efficiency and the representative time of the time interval (or the accumulated amount of discharge, or the accumulated amount of charge), and generates multiple clusters. The clusterer 215 calculates the function approximating each cluster, and generates the cluster characteristic information.

In step S5, the output unit 216 maps the clustered data items on the coordinate system, and outputs the mapped data items onto the display 217. Furthermore, the cluster characteristic information, the graph of the approximation function, information on the slope of the line approximating each cluster, etc. are also output onto the display 217. The display 217 displays, on the screen, various pieces of information input from the output unit 216. Note that any of mapping of the data items on the coordinate system, and clustering of the data items may be performed first; the order may be arbitrary selected.

According to this embodiment, based on the measurement data and the charge-discharge command value received from the energy storage system in normal operation, the times when the amount of charge satisfies the threshold condition are identified, and the time intervals satisfying the extraction condition are selected as the time intervals. For the selected time intervals, the respective charge-discharge efficiencies are calculated as evaluation indicators, and the charge-discharge efficiencies are clustered. The use condition of the rechargeable battery allowing a favorable charge-discharge efficiency (for example, the condition, such as the battery temperature, charge-discharge command value, or SOC) can be evaluated by comparing the characteristic information on each cluster. Since the measurement data acquired from the energy storage system in normal operation is used, the energy storage system is not necessarily made offline, and also charge and discharge with a special charge-discharge pattern is not necessarily executed, in order to evaluate the energy storage system. The variation in charge-discharge efficiency is plotted on the coordinate system having axes of the time and the accumulated amount of discharge or the accumulated amount of charge, thereby allowing the temporal variation in the healthiness of the rechargeable battery to be visualized.

Modified Example 1

The charge-discharge efficiency may be corrected by the temperature representing the time interval (representative temperature). The representative temperature is, for example, the mean temperature, the maximum temperature, the minimum temperature, etc. in the time interval. Typically, the internal resistance of the rechargeable battery tends to decrease with increase in the battery temperature. Consequently, if the battery temperature in operation is high, the calculated charge-discharge efficiency sometimes increases, in comparison of a low-temperature case. Accordingly, a reference temperature is preliminarily defined, and if the temperature is lower than the reference temperature, the charge-discharge efficiency is corrected to increase the charge-discharge efficiency. If the temperature is higher than the reference temperature, the charge-discharge efficiency is corrected so as to reduce the charge-discharge efficiency. For this correction, the relationship between the temperature and the charge-discharge efficiency is preliminarily acquired by a test, simulation or the like. Through use of this relationship, based on the charge-discharge efficiency at the reference temperature, the charge-discharge efficiency is normalized (corrected). For example, an expression (or formula) having the temperature and the charge-discharge efficiency as input variables, and the corrected temperature as the output variable, is preliminarily generated. The charge-discharge efficiency is corrected by inputting the representative temperature and the charge-discharge efficiency into this expression.

Figure 16:
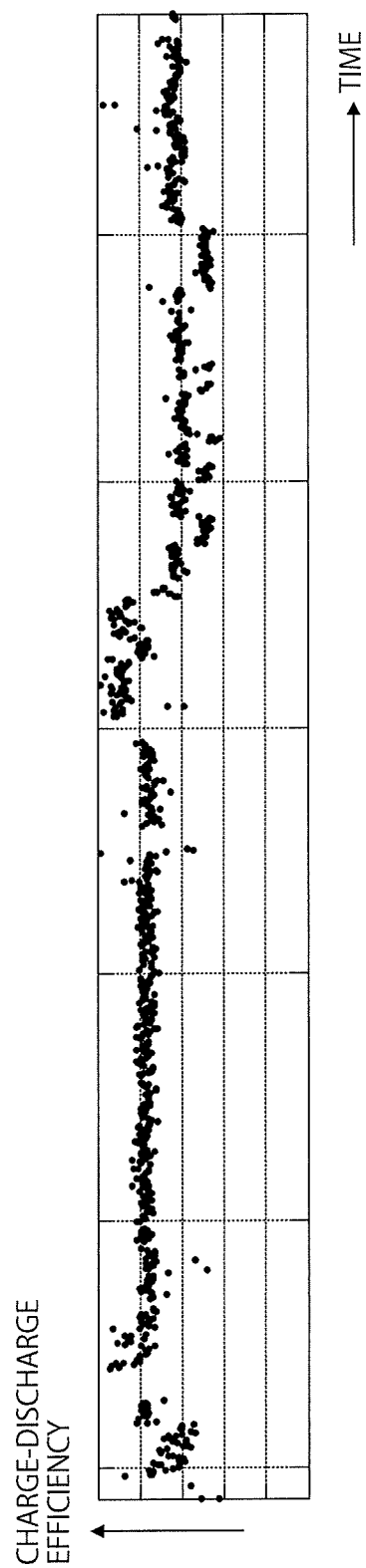
FIG. 16 shows an example of correcting the charge-discharge efficiency at each point in FIG. 12 according to a representative temperature.
Figure 17:
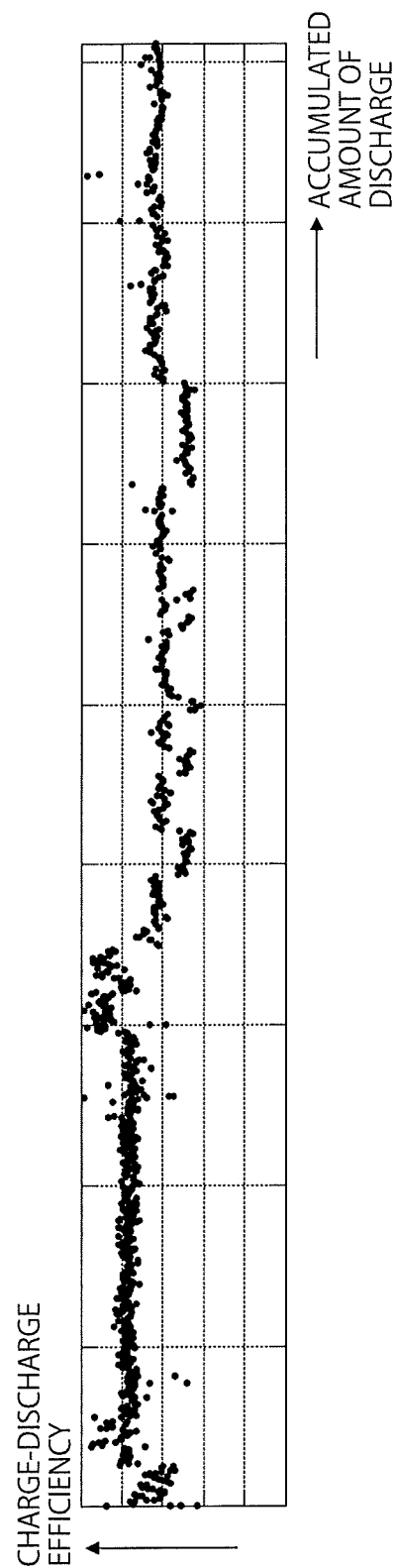
FIG. 17 shows an example of correcting the charge-discharge efficiency at each point in FIG. 13 according to a representative temperature.

FIG. 16 shows an example where the charge-discharge efficiency at each point in FIG. 12 is corrected in accordance with the representative temperature, and the corrected charge-discharge efficiency is mapped. FIG. 17 shows an example where the charge-discharge efficiency at each point in FIG. 13 is corrected in accordance with the representative temperature, and the corrected charge-discharge efficiency is mapped.

Processes performed after the charge-discharge efficiency is corrected are analogous to those in the embodiment described above. That is, data items where the corrected charge-discharge command value is associated with the representative time are generated, and the data items are mapped on the coordinate system and clustered, for example. The function approximating the cluster is generated. The cluster characteristic information is generated.

Modified Example 2

A method of determining the threshold "θ" is described. For example, the threshold "θ" is a predetermined ratio of the rated capacity of the rechargeable battery. For example, the ½ of the rated capacity of the rechargeable battery is used as the threshold "θ." In this case, if the amount of charge is represented in SOC, the threshold "θ" is 50%.

According to another method, the distribution of the amounts of charge may be generated, and the threshold "θ" may be determined on the basis of the generated distribution.

Figure 18:
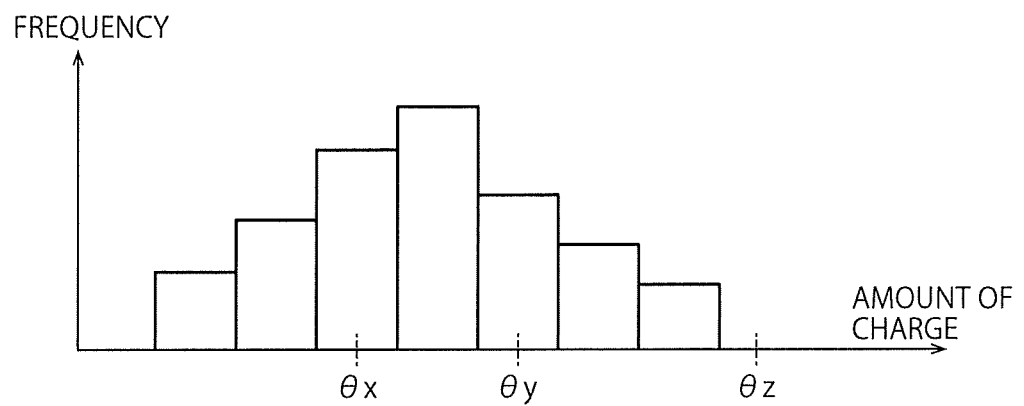
FIG. 18 schematically shows a histogram of amount of charge from a search start time to a search finish time.

FIG. 18 schematically shows a histogram of amounts of charge Q from a search start time to a search finish time. If the threshold is "θz" that is larger than the upper limit value of the histogram, the amount of charge does not reach this threshold "θz." Accordingly, the time satisfying the threshold condition cannot be detected. Consequently, the time interval cannot be selected either. Accordingly, a threshold is set between the upper limit and the lower limit of the histogram. For example, "θx" or "θy" or both of them are set. Many time intervals are expected to be selected by setting the threshold at the center of the histogram or adjacent thereto. Accordingly, the charge-discharge efficiencies can be calculated for more time intervals, and the number of samples for clustering can be increased. If multiple thresholds are set, the time satisfying the threshold condition is detected, selection of the time interval, calculation of the charge-discharge efficiency, mapping and clustering, and generation of the cluster characteristic information is performed for each threshold.

Figure 19:
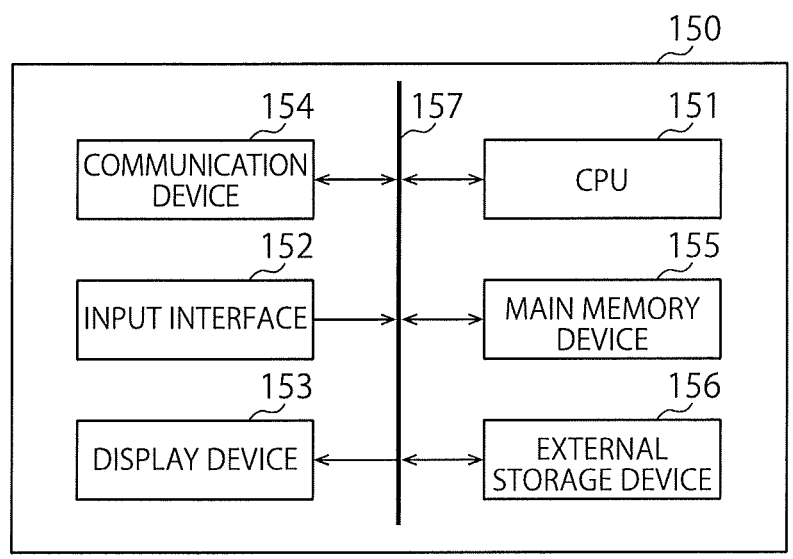
FIG. 19 shows a hardware configuration example of the rechargeable battery evaluation device according to the embodiment of the present invention.

FIG. 19 shows a hardware configuration example of the rechargeable battery evaluation device according to the embodiment of the present invention. The hardware configuration in FIG. 19 is implemented as a computer 150. The computer 150 includes a CPU 151, and input interface 152, a display device 153, a communication device 154, a main memory device 155, an external storage device 156, which are communicably connected to each other by a bus 157.

The input interface 152 acquires measurement data measured at the rechargeable battery via wiring and the like. The communication device 154 includes a wireless or wired communicator, and wiredly or wirelessly communicates with the energy storage system 101. The measurement data may be acquired via the communication device 154. The input interface 152 and the communication device 154 may be made up of separate circuits, such as integrated circuits, or a single circuit, such as an integrated circuit.

Examples of the external storage device 156 include storage media, such as HDD, SSD, a memory device, CD-R, CD-RW, DVD-RAM, and DVD-R. The external storage device 156 stores a program for causing the CPU 151 serving as a processor to execute the functions of the elements of the rechargeable battery evaluation device. The data storage 212 is also included in the external storage device 156. Here, only one external storage device 156 is shown. Alternatively, a plurality of external storage devices 156 may be arranged.

Under control by the CPU 151, a control program stored in the external storage device 156 is deployed on the main memory device 155, which stores data required to execute the program, data generated by execution of the program, etc. The main memory device 155 includes, for example, any type of memory or storage, such as a volatile memory (DRAM, SRAM, etc.) or a non-volatile memory (NAND flash memory, MRAM, etc.). The control program deployed on the main memory device 155 is executed by the CPU 151, thereby executing the functions the elements of the rechargeable battery evaluation device 201.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A device for evaluating an energy storage device, comprising:
first processing circuitry configured to:
detect a plurality of times at which an amount of charge of the energy storage device satisfies a threshold condition, based on measurement data on the energy storage device in operation, the energy storage device being configured to perform charge or discharge according to charge-discharge command values designating charge or discharge;
select a plurality of time intervals based on the plurality of times detected;
calculate a charge-discharge efficiency in each of the time intervals based on charge-discharge command values belonging to the time interval;
divide a set of the charge-discharge efficiencies into a plurality of clusters;
generate characteristic information on the clusters based on at least one of the measurement data and the charge-discharge command values; and
second processing circuitry configured to generate output data for displaying:
transition data indicating transition of the charge-discharge efficiency belonging to the cluster; and
characteristic information on the cluster.

2. The device according to claim 1, comprising a display configured to display the output data.

3. The device according to claim 1, wherein the threshold condition includes that the amount of charge reaches a threshold, or enters a certain range with respect to the threshold.

4. The device according to claim 3, wherein the threshold is a predetermined value of a ratio between the amount of charge of the energy storage device and a rated capacity of the energy storage device.

5. The device according to claim 1, wherein the first processing circuitry generates a distribution of the amounts of charge based on the measurement data, and determines the threshold condition based on the distribution.

6. The device according to claim 1, wherein the transition data includes data associating the charge-discharge efficiency with the time.

7. The device according to claim 1, wherein the transition data includes data associating the charge-discharge efficiency with an accumulated amount of discharge of the energy storage device or wherein the transition data includes data associating the charge-discharge efficiency with an accumulated amount of charge of the energy storage device.

8. The device according to claim 1, wherein the first circuitry generates a function of approximating the cluster, and the transition data includes a graph of the function.

9. The device according to claim 1, wherein the first processing circuitry calculates a standard deviation of at least one of: the charge-discharge command values belonging to the time interval; and the measurement data belonging to the time interval, and wherein the first processing circuitry generates statistical information associated with the standard deviation, the generated statistical information being the characteristic information on the cluster.

10. The device according to claim 1, wherein the first processing circuitry calculates information on a slope of a line approximating the cluster, the calculated information being the characteristic information on the cluster.

11. The device according to claim 1, wherein the first processing circuitry selects an interval where a time difference between the times is equal to or more than a predetermined value, the selected interval being the time interval.

12. The device according to claim 11, wherein the interval where the time difference between the times is equal to or more than the predetermined value is an interval where the number of samples of the measurement data is equal to or more than the predetermined value.

13. The device according to claim 1, wherein the first processing circuitry selects an interval where a total of lengths of periods during which neither charge nor discharge is designated by the charge-discharge command values is equal to or less than a predetermined value, the selected interval being the time interval.

14. The device according to claim 1,
wherein the first processing circuitry selects an interval where a difference between a mean value of the amounts of charge and a threshold is equal to or less than a predetermined value, the selected interval being the time interval.

15. The device according to claim 1,
wherein the threshold condition includes that the amount of charge reaches a first threshold or a second threshold,
wherein processes of the first processing circuitry and the second processing circuitry are performed for each of the first threshold and the second threshold, and
wherein characteristic information on the cluster based on the first threshold includes information identifying the first threshold, and
wherein characteristic information on the cluster based on the second threshold includes information identifying the second threshold.

16. The device according to claim 1,
wherein the first processing circuitry corrects the charge-discharge efficiency based on the measurement data belonging to the time interval for which the charge-discharge efficiency is calculated, wherein the measurement data includes a temperature.

17. A method for evaluating an energy storage device, comprising:
detecting a plurality of times at which an amount of charge of the energy storage device satisfies a threshold condition, based on measurement data on the energy storage device in operation, the energy storage device being configured to perform charge or discharge according to charge-discharge command values designating charge or discharge;
selecting a plurality of time intervals based on the plurality of times detected;
calculating a charge-discharge efficiency in each of the time intervals based on charge-discharge command values belonging to the time interval;
dividing a set of the charge-discharge efficiencies into a plurality of clusters;
generating characteristic information on the clusters based on at least one of the measurement data and the charge-discharge command values; and
generating output data for displaying:
    transition data indicating transition of the charge-discharge efficiency belonging to the cluster; and
    characteristic information on the cluster.

18. An evaluation system, comprising:
an energy storage device configured to perform charge or discharge according to charge-discharge command values designating charge or discharge; and
an evaluation device for the energy storage device,
wherein
the evaluation device comprises:
first processing circuitry configured to:
    detect a plurality of times at which an amount of charge of the energy storage device satisfies a threshold condition, based on measurement data on the energy storage device in operation;
    select a plurality of time intervals based on the plurality of times detected;
    calculate a charge-discharge efficiency in each of the time intervals based on charge-discharge command values belonging to the time interval;
    divide a set of the charge-discharge efficiencies into a plurality of clusters;
    generate characteristic information on the clusters based on at least one of the measurement data and the charge-discharge command values; and
second processing circuitry configured to generate output data for displaying:
    transition data indicating transition of the charge-discharge efficiency belonging to the cluster; and
    characteristic information on the cluster.

* * * * *